United States Patent
DeLoach et al.

(10) Patent No.: US 7,422,967 B2
(45) Date of Patent: *Sep. 9, 2008

(54) METHOD FOR MANUFACTURING A SEMICONDUCTOR DEVICE CONTAINING METAL SILICIDE REGIONS

(75) Inventors: Juanita DeLoach, Plano, TX (US); Lindsey H. Hall, Plano, TX (US); Lance S. Robertson, Rockwall, TX (US); Jiong-Ping Lu, Richardson, TX (US); Donald S. Miles, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 469 days.

This patent is subject to a terminal disclaimer.

(21) Appl. No.: 11/127,669

(22) Filed: May 12, 2005

(65) Prior Publication Data

US 2006/0258091 A1 Nov. 16, 2006

(51) Int. Cl.
*H01L 21/3205* (2006.01)
(52) U.S. Cl. ............... 438/513; 438/592; 257/E21.165
(58) Field of Classification Search ............ 438/407, 438/513, 592, 651; 257/E21.619
See application file for complete search history.

(56) References Cited

U.S. PATENT DOCUMENTS

| | | | |
|---|---|---|---|
| 7,208,409 B2 * | 4/2007 | Lu et al. ............. | 438/664 |
| 2001/0045605 A1 * | 11/2001 | Miyashita et al. ...... | 257/382 |
| 2002/0168828 A1 * | 11/2002 | Cheng et al. ........... | 438/303 |

* cited by examiner

*Primary Examiner*—Chandra Chaudhari
(74) *Attorney, Agent, or Firm*—Wade James Brady, III; Frederick J. Telecky, Jr.

(57) ABSTRACT

The present invention provides a method for manufacturing a semiconductor device. In one embodiment of the present invention, without limitation, the method for manufacturing the semiconductor device includes forming a gate structure (120) over a substrate (110) and forming source/drain regions (190) in the substrate (110) proximate the gate structure (120). The method further includes forming fluorine containing regions (220) in the source/drain regions (190) employing a fluorine containing plasma using a power level of less than about 75 Watts, forming a metal layer (310) over the substrate (110) and fluorine containing regions (220), and reacting the metal layer (310) with the fluorine containing regions (220) to form metal silicide regions (410) in the source/drain regions (190).

13 Claims, 3 Drawing Sheets

METHOD FOR MANUFACTURING A SEMICONDUCTOR DEVICE CONTAINING METAL SILICIDE REGIONS

TECHNICAL FIELD OF THE INVENTION

The present invention is directed, in general, to a method for manufacturing a semiconductor device and, more specifically, to a method for manufacturing a semiconductor device containing metal silicide regions.

BACKGROUND OF THE INVENTION

Traditional metal-oxide-semiconductor (MOS) transistors often use metal silicide layers to reduce resistance. A self-aligned silicidation process (salicide) is often used to form the region of titanium, cobalt or tungsten silicide on the gate electrode and source/drain regions of the MOS transistor. In this process, a blanket metal film is deposited on the silicon substrate containing the MOS transistor structure. The metal is then reacted with the underlying silicon regions to form a low resistance metal silicide. Any unreacted metal remaining on the substrate is then removed using a metal etch process that is selective to the remaining metal silicide.

In order to reduce the resistances associated with the metal silicide regions, nickel is finding increasing use in forming the metal silicide regions in MOS transistors, particularly for transistors with physical gate lengths of less than 40 nm and/or MOS transistors with ultra-shallow junctions. Nickel, unfortunately, has a very high diffusivity in silicon leading to the formation of nickel silicide regions that extend beneath the transistor sidewall structures. Regrettably, the nickel silicide regions that extend beneath the transistor sidewall structures tend to lead to nickel silicide excessive encroachment defects extending into the channel region of the MOS transistor. In a similar manner, the high diffusivity of nickel causes excessive spike defects into the source/drain regions. As would be expected, the encroachment and spike defects tend to cause serious acceptance, manufacturability, and ultimately device yield problems.

There is therefore a need for a method to form metal silicide regions in MOS transistors that does not experience the severe defect issues caused by the traditional methods.

SUMMARY OF THE INVENTION

To address the above-discussed deficiencies of the prior art, the present invention provides a method for manufacturing a semiconductor device. In one embodiment of the present invention, without limitation, the method for manufacturing the semiconductor device includes forming a gate structure over a substrate and forming source/drain regions in the substrate proximate the gate structure. The method further includes forming fluorine containing regions in the source/drain regions employing a fluorine containing plasma using a power level of less than about 75 Watts, forming a metal layer over the substrate and fluorine containing regions, and reacting the metal layer with the fluorine containing regions to form metal silicide regions in the source/drain regions.

In a different embodiment of the invention, however, the method for manufacturing the semiconductor device includes, again without limitation, pretreating a plasma chamber using fluorine and placing a semiconductor substrate having a gate structure formed thereover and source/drain regions therein within the pretreated plasma chamber, and forming fluorine containing regions in the source/drain regions. This method further includes forming a metal layer over the substrate and fluorine containing regions, and reacting the metal layer with the fluorine containing regions formed in the pretreated plasma chamber to form metal silicide regions in the source/drain regions.

In yet another embodiment of the present invention, the method for manufacturing the semiconductor device may include forming a gate structure over a substrate, and forming source/drain regions in the substrate proximate the gate structure. The method may also include adjusting an inclusion of fluorine into the source/drain regions as a function of a predetermined thickness of a metal layer formed over the source/drain regions, or adjusting a thickness of the metal layer formed over the source/drain regions as a function of an inclusion of fluorine into the source/drain regions, and reacting the metal layer with the source/drain regions to form metal silicide regions in the source/drain regions.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

While the following description of the instant invention revolves around FIGS. 1–4, the instant invention can be utilized in many semiconductor device structures. The methodology of the instant invention provides a solution to forming metal silicide regions with a smooth interface that do not extend under the transistor sidewall structures, through the inclusion of fluorine within the source/drain regions. The methodology of the instance invention further provides a solution for providing reduced sheet resistance in addition to the inclusion of fluorine, particularly for source/drain silicide contacts with boron doping. The methodology of the instance invention further provides a solution for providing reduced sheet resistance in addition to the inclusion of fluorine. Additionally, the methodology of the instant invention provides a solution for obtaining consistent fluorine levels in the source/drain regions of the semiconductor device structures across various wafers in a lot.

Turning now to FIGS. 1–4, illustrated are cross-sectional views of detailed manufacturing steps instructing how one might, in an advantageous embodiment, manufacture a semiconductor device in accordance with the principles of the present invention. In discussing FIGS. 1–4, various different embodiments of the present invention will be discussed. It should nevertheless be understood that the scope of the present invention is not limited to the combination of these various embodiments. Accordingly, any one embodiment alone or any combination of embodiments could be used while staying within the purview of the claimed invention.

Figure 1:
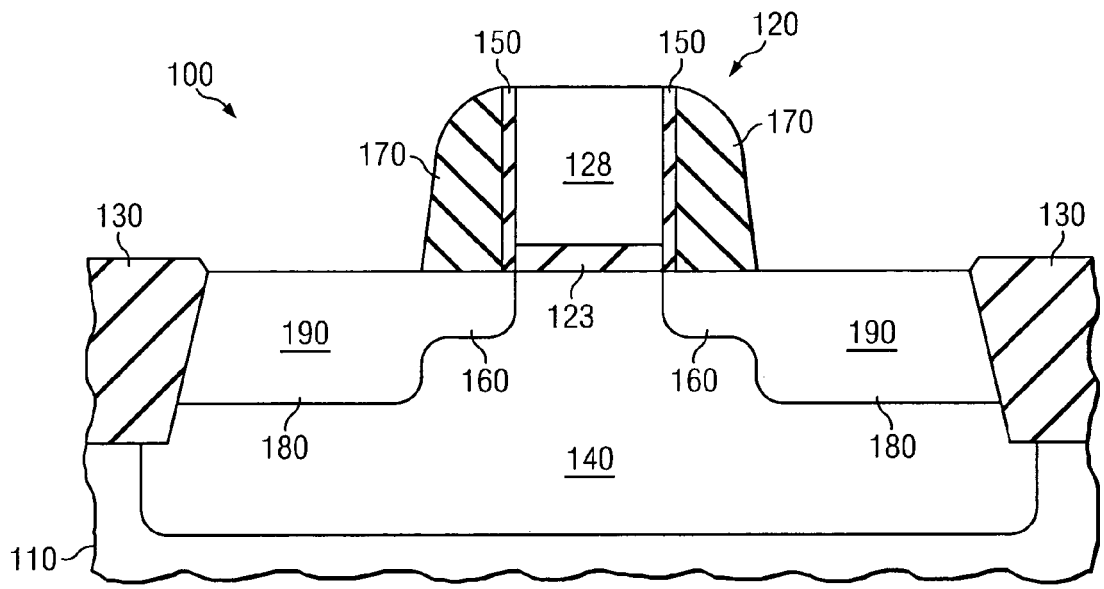
FIG. 1 illustrates a cross-sectional view of a partially completed semiconductor device at an initial stage of manufacture.

The partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer). In the illustrative embodiment shown, the substrate 110 comprises an epitaxial silicon layer.

As is illustrated in FIG. 1, a gate structure 120 is formed over the substrate 110. The gate structure 120, in the embodiment shown, includes a gate dielectric layer 123 and a gate electrode layer 128. The gate dielectric layer 123 may, for example, comprise an oxide, thermally grown $SiO_2$, a nitride, an oxynitride, or any combination thereof, and preferably has a thickness ranging from about 1 nm to about 20 nm. The gate dielectric layer 123 can also be formed using a high K dielectric material with a dielectric constant greater than about 3.9. Some examples of high K dielectric material include hafnium-containing dielectrics such as hafnium oxide, hafnium oxynitride, etc.

As previously indicated, the gate structure 120 further includes a gate electrode layer 128. The gate electrode layer 128 in one advantageous embodiment comprises a layer of silicon-containing material formed on the gate dielectric layer 123. Preferably, this silicon-containing material is comprised of polycrystalline silicon ("poly" or "polysilicon"), but it may comprise amorphous silicon, epitaxial silicon or any other semiconducting material.

Located within the substrate 110 and between isolation regions 130 is a well region 140. The well region 140 in the substrate 110 shown in FIGS. 1–4 can be either n-type or p-type. In forming CMOS integrated circuits, n-type and p-type well regions 140 are formed in the substrate 110. In the case of an n-well region, a PMOS transistor will be formed. In a similar manner for a p-well region, an NMOS transistor will be formed.

With the gate structure 120 defined using standard photolithography processes and polysilicon etching, a spacer 150 is formed, for example, by first thermally growing about 1 nm to about 5 nm of oxide followed by depositing about 15 nm of TEOS oxide. In other embodiments the spacer 150 can comprise a combination of silicon nitride and/or silicon oxide (either grown or deposited) layers.

For a PMOS transistor where the well region 140 comprises a portion of an n-type well, a blanket p-type lightly doped implant is performed resulting in the lightly doped extension implants 160. The p-type lightly doped extension implants 160 are often referred to as lightly doped drain (LDD) or moderately doped drain (MDD) extension regions. The p-type lightly doped extension implants 160 are conventionally formed and generally have a peak dopant concentration ranging from about 1E19 atoms/$cm^3$ to about 2E20 atoms/$cm^3$.

In addition to the p-type lightly doped extension implants 160, pocket implants (not shown) are sometimes performed. For the case where the semiconductor device 100 shown in FIG. 1 is a PMOS transistor, the pocket implants would comprise an n-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the n-type pocket implant can consist of As, P or any other suitable n-type dopant. The species of the p-type lightly doped extension implants 160 can consist of boron or any other suitable p-type dopant. The order of the implants is somewhat arbitrary and the pocket implant can be performed before the p-type lightly doped extension implants 160.

For an NMOS transistor where the well region 140 comprises a portion of a p-type well, a blanket n-type lightly doped implant is performed resulting in n-type lightly doped extension implants 160. The n-type lightly doped extension implants 160 are also often referred to as a lightly doped drain (LDD) or a moderately doped drain (MDD) extension region. The n-type lightly doped extension implants 160 are conventionally formed and generally have a peak dopant concentration ranging from about 1E19 atoms/$cm^3$ to about 2E20 atoms/$cm^3$.

In addition to the n-type lightly doped extension implants 160, pocket implants are again sometimes performed. For the case where the transistor shown in FIG. 1 is an NMOS transistor, the pocket implant would comprise a p-type dopant species. The species of the p-type pocket implant can consist of B, $BF_2$, Ga, In, or any other suitable p-type dopant. The species of the n-type lightly doped extension implants 160 can consist of As, P, Sb, or any other suitable n-type dopant. The order of the implants is again somewhat arbitrary and the n-type lightly doped extension implants 160 could be performed before the pocket implant.

After the completion of the lightly doped extension implants 160 (and pocket implant if performed), and any subsequent processing, sidewall spacers 170 are formed as shown in FIG. 1. In an embodiment of the instant invention, the sidewall spacers 170 comprise a plurality of silicon oxide and silicon nitride dielectric layers. The sidewall spacers 170 are formed by first depositing blanket layers of suitable dielectric material. An anisotropic etch is then used to form the sidewall spacers 170. The sidewall spacers 170 can also be formed using a single suitable dielectric material such as silicon nitride or silicon oxide.

Following the formation of the sidewall spacers 170, highly doped source/drain implants 180 are formed. For a PMOS transistor, a p-type dopant such as boron is implanted into the substrate 110 adjacent to the sidewall spacers 170 to form the highly doped source/drain implants 180. For an NMOS transistor, an n-type dopant such as arsenic and/or phosphorous is implanted into the substrate 110 adjacent to the sidewall spacers 170 to form the highly doped source/drain implants 180. The highly doped source/drain implants 180 are conventionally formed and generally have a peak dopant concentration ranging from about 1E18 atoms/cm$^3$ to about 1E21 atoms/cm$^3$.

Following the formation of the highly doped source/drain implants 180, a high temperature source/drain anneal may be performed to activate the implanted dopants and remove the damage to the substrate 110 created during the ion implantation process. What results are source/drain regions 190. The source/drain anneal can comprise a rapid thermal annealing (RTA) process where the source/drain regions 190 are annealed at temperatures above about 800° C. for times ranging from about a second to minutes.

Figure 2:
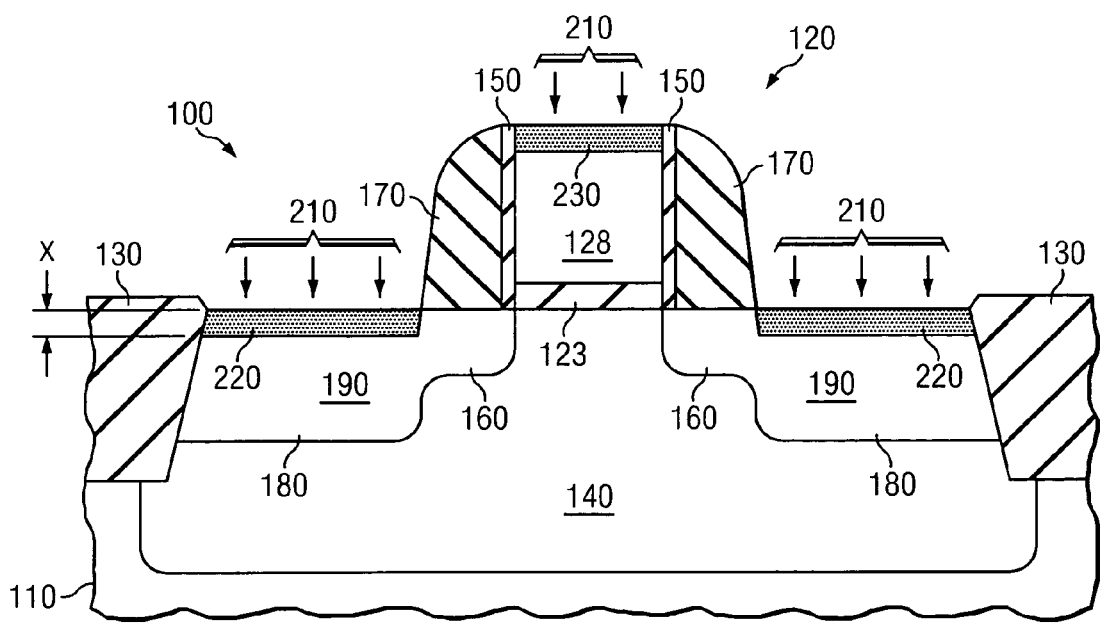
FIG. 2 illustrates a cross-sectional view of the partially completed semiconductor device illustrated in FIG. 1 after placing fluorine within the partially completed semiconductor device, thereby forming fluorine containing regions in the source/drain regions.

Turning now to FIG. 2, illustrated is a cross-sectional view of the partially completed semiconductor device 100 illustrated in FIG. 1 after placing fluorine 210 within the partially completed semiconductor device 100, thereby forming fluorine containing regions 220 in the source/drain regions 190. It should be noted that in a preferred embodiment of the present invention, the fluorine containing regions 220 are formed after the source/drain region 190 annealing processes have been completed. The fluorine containing regions 220 are near surface regions with a depth x ranging from about 0.5 nm to about 30 nm and fluorine concentrations ranging from about 1E17 atoms/cm$^3$ to about 5E21 atoms/cm$^3$. Other depths and concentrations are, however, within the broad scope of the present invention.

In an exemplary embodiment, the fluorine containing regions 220 are formed by exposing the source/drain regions 190 to a fluorine containing plasma. Such a process may include flowing NF$_3$ at a flow rate ranging from about 1 sccm to about 20 sccm, N$_2$ at a flow rate ranging from about 0 sccm to about 100 sccm, and flowing H$_2$ at a flow rate ranging from about 0 sccm to about 100 sccm and/or Ar at a flow rate of about 0 sccm to about 100 scam, in a plasma chamber. Other gases that can be used in a plasma to form the fluorine containing region 220 include NF$_3$/H$_2$, NF$_3$/NH$_3$, NF$_3$/N$_2$, NF$_3$/Ar, NF$_3$/N$_2$/H$_2$, CF$_4$/H$_2$/Ar, C$_2$F$_6$/Ar, and C$_2$F$_6$/H$_2$.

The fluorine containing plasma process disclosed herein, in certain advantageous embodiments of the present invention, may be conducted using an RF power level of less than about 75 watts. In one exemplary embodiment, the RF power level ranges from about 70 watts to about 10 watts, with a preferred value of about 50 watts. In a similar advantageous embodiment of the present invention, the pressure at which the plasma chamber is held during the fluorine containing plasma process is less than about 70 mtorr, with an exemplary range of about 30 mtorr to about 40 mtorr.

Heretofore, the industry did not readily recognize the disadvantages that result from the removal of excessive amounts of silicon by the fluorine containing plasma process. This unique recognition, especially when coupled with the knowledge of including the fluorine 210 within the source/drain regions 190, lead to the realization that the aforementioned disclosed RF power levels and pressures could be used to include the fluorine 210 within the source/drain regions 190 without simultaneously removing undesirable portions of the layers being subjected to the fluorine containing plasma process. While exemplary results may be obtained for current technology nodes using the aforementioned RF powers and pressures, it is believed that these RF powers and pressures will provide unparalleled results for future technology nodes wherein the prevention of silicon removal is mandatory. While it will be discussed in much greater detail with respect to FIG. 3 below, the specific parameters of the inclusion of fluorine into the source/drain regions may be adjusted as a function of a predetermined thickness of a metal layer formed over the source/drain regions, or vice-versa.

During the process of forming the fluorine containing regions 220 in the source/drain regions 190, a fluorine containing region 230 may also be formed in the gate electrode layer 128. The fluorine containing region 230 in the gate electrode layer 128 will assist in the subsequent formation of the metal silicide layer that will be formed in the gate electrode layer 128. In those instances where no fluorine containing region is desired in the gate electrode layer 128, a blocking layer or mask can be used to mask the gate electrode layer 128 during the fluorine incorporation process.

The fluorine containing plasma processes of the instant invention should be differentiated from other fluorine containing plasmas used to etch oxides and/or perform other types of surface treatments. These processes are optimized to not incorporate fluorine into the underlying silicon regions and in fact are optimized to leave no fluorine containing residue. The ability of fluorine to confine the formation of metal silicide regions was unknown prior to the instant invention and the formation of a near surface region of fluorine using plasmas is counter intuitive to the current uses of fluorine containing plasmas in the semiconductor arts.

Another advantageous embodiment of the present invention that is associated with the inclusion of the fluorine 210 into the source/drain regions 190 is the pretreatment of the plasma chamber before running a first wafer or a lot of wafers having source/drain regions needing fluorine included therein. In conducting experiments on other aspects of the present invention, it was recognized that the first couple of wafers in a batch or lot of wafers needing the fluorine, had inconsistent amounts of fluorine therein. For instance, the first couple of wafers would typically have more fluorine than desired, and even more troubling, the fluorine amounts would vary between and/or across the wafers. It was observed, however, that after the first couple of wafers had been run, the fluorine level would approach the desired and fixed level.

Accordingly, those associated with the present inventions recognized that a pretreatment of the plasma chamber could be conducted prior to the first product wafer being subjected to the fluorine containing plasma in the plasma chamber. This pretreatment may be conducted a variety of different ways. For instance, in one embodiment a dummy wafer or plurality of dummy wafers are processed in the presence of the fluorine containing plasma to season the plasma chamber. Accordingly, when the product wafers are finally placed within the plasma chamber in the presence of the fluorine containing plasma, the aforementioned problems have been substantially reduced, if not eliminated. Another embodiment of the present invention has the fluorine containing plasma seasoning the plasma chamber without either a dummy wafer or product wafer therein. It is believed that this embodiment provides results similar to the dummy wafer embodiment previously discussed. However, the embodiment that does not require the dummy wafer might only be available for those plasma chambers capable of striking a plasma without a wafer on the chuck.

The time for conducting the plasma pretreatment obviously may vary. However, it has been observed that in certain advantageous situations a plasma pretreatment for a time period substantially similar to the time period upon which a single product wafer would be subjected to the fluorine containing plasma, is sufficient. In certain embodiments this time period may overseason the plasma chamber, however, the overseasoning of the plasma chamber is not known to have any detrimental effects on the actual product wafers. Thus, in accordance with the principles of the present invention, the pretreatment occurs for a time period ranging from about 10 seconds to about 600 seconds. Similarly, the other fluorine containing plasma conditions may be similar for both the pretreatment and the product wafers.

Figure 3:
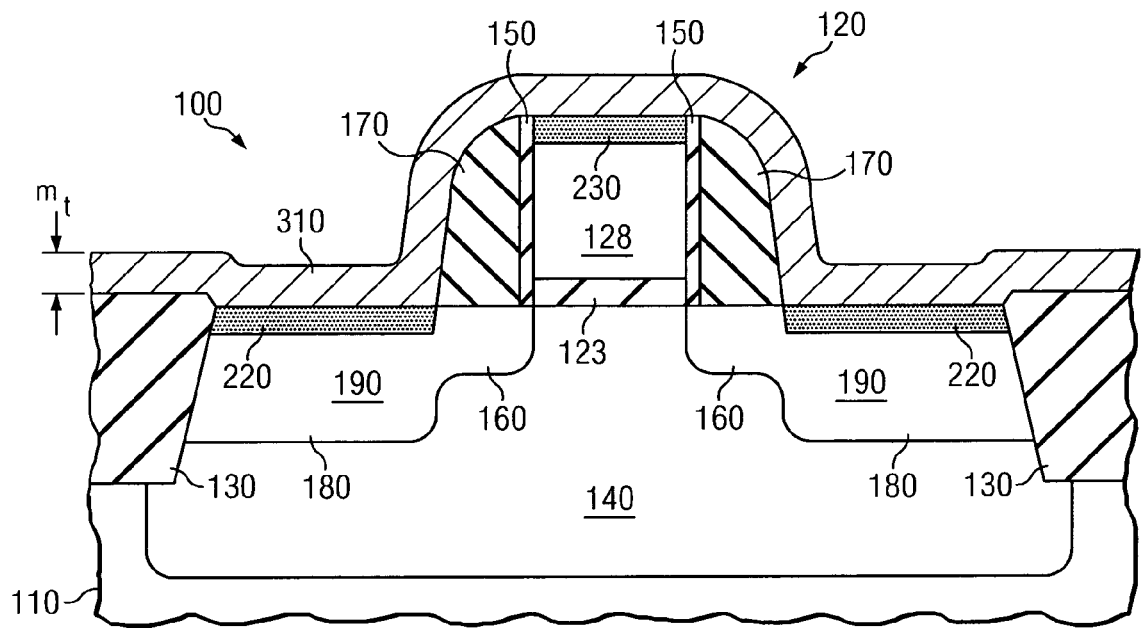
FIG. 3 illustrates a cross-sectional view of the partially completed semiconductor device illustrated in FIG. 2 after forming a metal layer over the source/drain regions.

Turning now to FIG. 3, illustrated is a cross-sectional view of the partially completed semiconductor device 100 illustrated in FIG. 2 after forming a metal layer 310 over the source/drain regions 190. In an embodiment of the instant invention the metal layer 310 comprises nickel. In addition to nickel, other metals include cobalt, molybdenum, platinum, etc. For the case where nickel is used to form the metal layer 310, the thickness $m_t$ of the metal layer 310 should range from about 3 nm to about 40 nm. In a more particular embodiment of the invention, the thickness $m_t$ of the metal layer 310 is between about 4 nm and about 8 nm. Other thicknesses, while generally not desired, are however within the purview of the present invention. In some instances, the formation of the fluorine containing layer 220 and the subsequent metal layer 310 can be performed in-situ in multiple chambers of a single cluster tool or in a single chamber.

At this point in the process it should be noted that it has been observed that the sheet resistance of the resulting metal silicided regions 410 (FIG. 4) may be substantially reduced by tailoring the inclusion of fluorine 210 into the source/drain regions 190 as a function of a predetermined thickness of the metal layer 310 formed over the source/drain regions 190. It has also been observed that the sheet resistance of the resulting metal silicided regions 410 (FIG. 4) may be substantially reduced by tailoring the thickness $m_t$ of the metal layer 310 formed over the source/drain regions 190 as a function of the inclusion of fluorine 210 into the source/drain regions 190. While it is generally preferred to tailor the inclusion of fluorine 210 into the source/drain regions 190 based upon the predetermined thickness of the metal layer 310, the key is that they are tailored to one another.

In those embodiments wherein the inclusion of fluorine 210 into the source/drain regions 190 is adjusted based upon the predetermined thickness $m_t$ of the metal layer 310, the concentration of fluorine 210 in the source/drain regions 190 may be adjusted. For instance, for a predetermined thickness $m_t$ of the metal layer 310 of about 4 nm the amount of fluorine 210 should be tailored to range from about $1E12$ atoms/cm$^3$ to about $4E12$ atoms/cm$^3$, for a predetermined thickness $m_t$ of the metal layer 310 of about 6 nm the amount of fluorine 210 should be tailored to range from about $1E12$ atoms/cm$^3$ to about $6E12$ atoms/cm$^3$, or for a predetermined thickness $m_t$ of the metal layer 310 of about 8 nm the amount of fluorine 210 should be tailored to range from about $1E12$ atoms/cm$^3$ to about $8E12$ atoms/cm$^3$. In an alternative embodiment, however, the adjusting the inclusion of fluorine may include adjusting thermal process conditions for the reaction between the metal layer 310 and underneath substrate 110.

Figure 4:
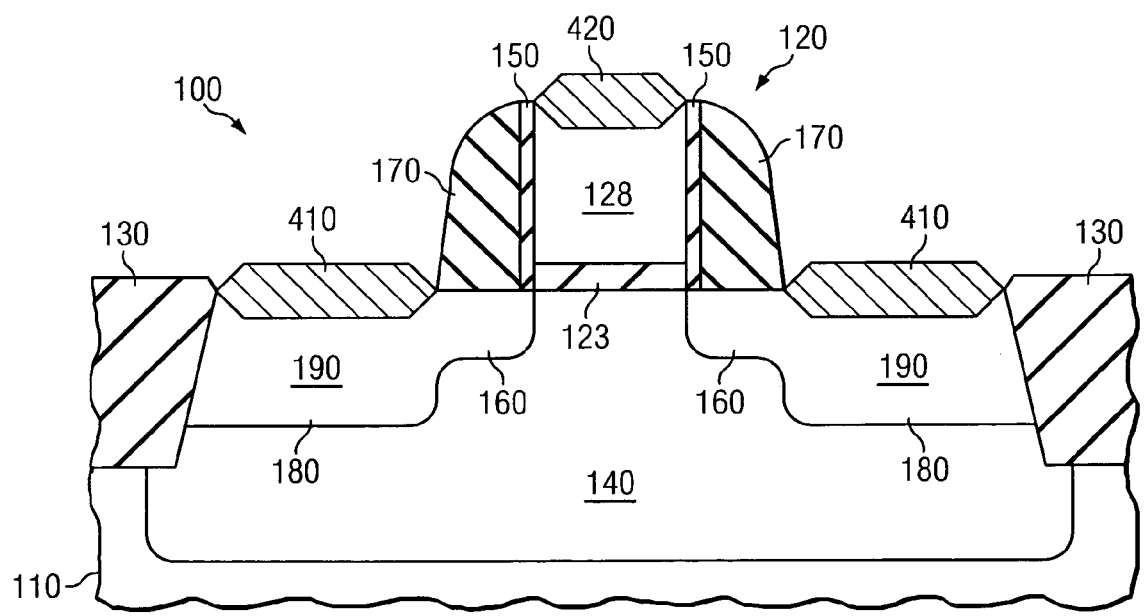
FIG. 4 illustrates a cross-sectional view of the partially completed semiconductor device illustrated in FIG. 3 after subjecting the metal layer to an anneal, thereby causing the metal layer to react with the underlying silicon regions to form metal silicide regions.

Turning to FIG. 4, illustrated is a cross-sectional view of the partially completed semiconductor device illustrated in FIG. 3 after subjecting the metal layer 310 to an anneal, thereby causing the metal layer 310 to react with the underlying silicon regions to form metal silicide regions 410, 420. It should be noted that no reaction takes place in the embodiment of FIG. 4 between the metal layer 310 and the sidewall spacers 170.

Following the formation of the metal silicide regions 410, 420, the unreacted metal may be chemically removed. In the case where nickel is used to form the metal layer 310, nickel monosilicide (NiSi) is formed by annealing the nickel metal layer 310 at temperatures ranging from about 250° C. to about 550° C. In this embodiment, the fluorine containing regions 220, 230 will be consumed during the silicide formation process and there will be a pile-up of fluorine at an interface of the nickel metal silicided regions 410 and the source/drain regions 190. Following the process of the instant invention, the measured fluorine concentration at the interface between the nickel metal silicided regions 410 and the underlying source/drain regions 190 will be on the order of about $1E17$ atoms/cm$^3$ to about $5E21$ atoms/cm$^3$. During the formation of the metal silicide regions 410 in the source/drain regions 190, a metal silicided region 420 may also be simultaneously formed in the gate electrode layer 128. After completing the metal silicide regions 410, 420, the process would continue in a conventional manner.

Figure 5:
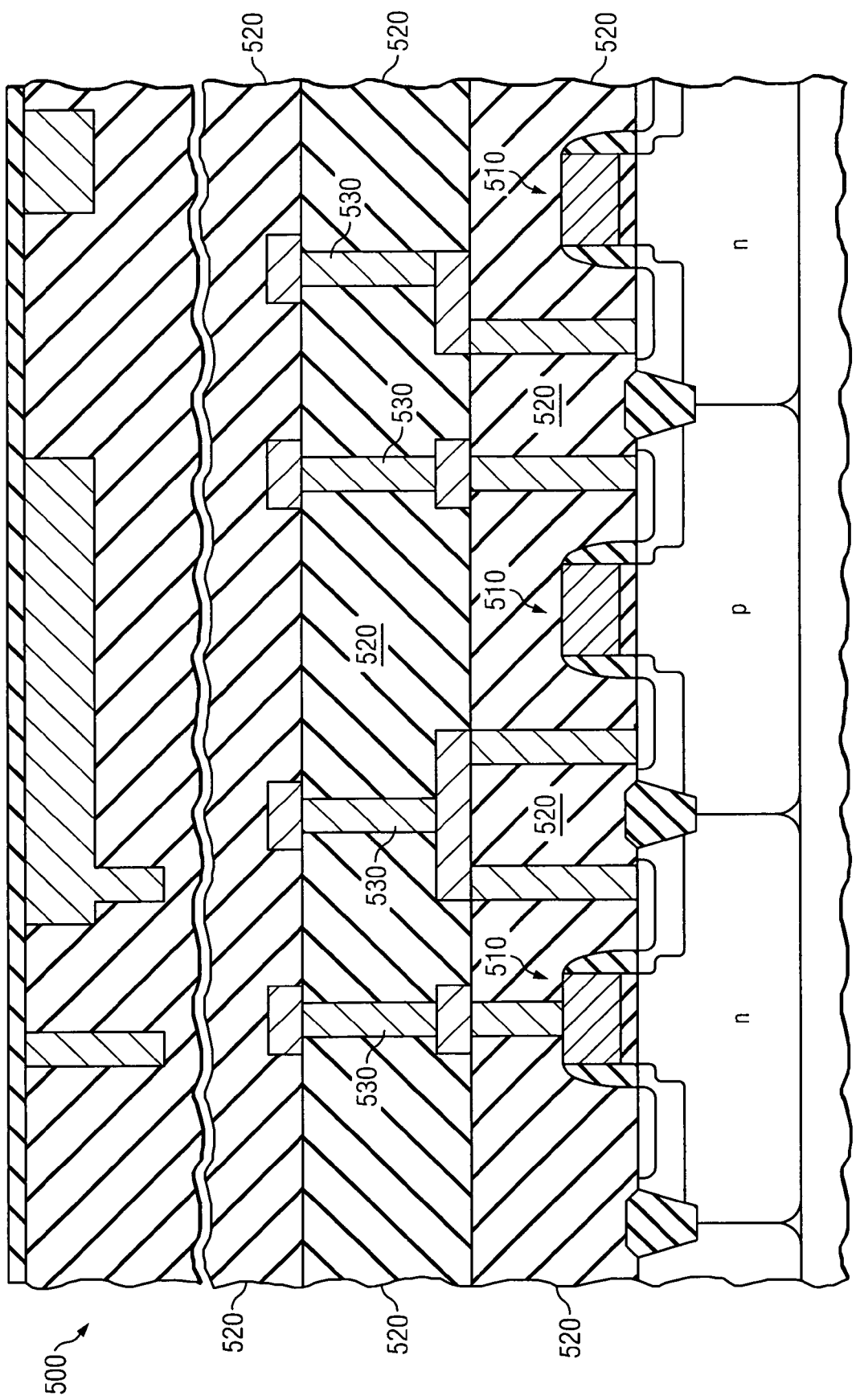
FIG. 5 illustrates a cross-sectional view of a conventional integrated circuit (IC) incorporating a semiconductor device constructed according to the principles of the present invention.

Referring finally to FIG. 5, illustrated is a cross-sectional view of a conventional integrated circuit (IC) 500 incorporating a semiconductor device 510 constructed according to the principles of the present invention. The IC 500 may include devices, such as transistors used to form CMOS devices, BiCMOS devices, Bipolar devices, or other types of devices. The IC 500 may further include passive devices, such as inductors or resistors, or it may also include optical devices or optoelectronic devices. Those skilled in the art are familiar with these various types of devices and their manufacture. In the particular embodiment illustrated in FIG. 5, the IC 500 includes the semiconductor devices 510 having dielectric layers 520 located thereover. Additionally, interconnect structures 530 are located within the dielectric layers 520 to interconnect various devices, thus, forming the operational integrated circuit 500.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:

forming a gate structure over a substrate;

forming source/drain regions in the substrate proximate the gate structure;

forming fluorine containing regions in the source/drain regions employing a fluorine containing plasma using a power level ranging from about 10 Watts to about 70 Watts, using a pressure of less than about 30 mtorr to about 40 mtorr;

forming a metal layer over the substrate and fluorine containing regions; and reacting the metal layer with the fluorine containing regions to form metal silicide regions in the source/drain regions.

2. The method as recited in claim 1 further comprising annealing the source/drain regions prior to forming the fluorine containing regions.

3. The method as recited in claim 1 wherein the fluorine containing regions include a fluorine concentration ranging from about $1E17$ atoms/cm$^3$ to about $5E21$ atoms/cm$^3$.

4. The method as recited in claim 1 wherein forming fluorine containing regions includes exposing the source/drain regions to a fluorine containing plasma with a $NF_3$ flow rate ranging from about 1 sccm to about 20 sccm, an $N_2$ flow rate ranging from about 0 sccm to about 100 sccm, and a $H_2$ flow rate ranging from about 0 sccm to about 100 sccm in a plasma chamber.

5. A method for manufacturing a semiconductor device, comprising:

pretreating a plasma chamber using a first fluorine containing plasma;

placing a semiconductor substrate having a gate structure formed thereover and source/drain regions therein within the pretreated plasma chamber, and forming fluorine containing regions in the source/drain regions using a second fluorine containing plasma;

forming a metal layer over the substrate and fluorine containing regions; and reacting the metal layer with the fluorine containing regions formed in the pretreated plasma chamber to form metal silicide regions in the source/drain regions.

6. The method as recited in claim 5 wherein pretreating a plasma chamber using fluorine includes pretreating a plasma chamber using fluorine containing plasma.

7. The method as recited in claim 5 wherein the first fluorine containing plasma occurs for a time period ranging from about 10 seconds to about 600 seconds.

8. The method as recited in claim 7 wherein the first and second fluorine containing plasmas occur for substantially similar time periods.

9. The method as recited in claim 5 wherein pretreating a plasma chamber using fluorine occurs in the presence of a dummy wafer.

10. The method as recited in claim 5 wherein pretreating a plasma chamber using fluorine occurs in the absence of a semiconductor wafer.

11. A method for manufacturing a semiconductor device, comprising:

forming a gate structure over a substrate;

forming source/drain regions in the substrate proximate the gate structure;

adjusting an inclusion amount of fluorine into the source/drain regions as a function of a predetermined thickness of a metal layer formed over the source/drain, wherein the amount of fluorine should range from about $1e12$ atoms/cm$^3$ to about $4e12$ atoms/cm$^3$ for a predetermined thickness of the metal layer of about 4 nm, the amount of fluorine should range from about $1e12$ atoms/cm$^3$ to about $6e12$ atoms/cm$^3$ for a predetermined thickness of the metal layer of about 6 nm. or the amount of fluorine should range from about $1e12$ atoms/cm$^3$ to about $8e12$ atoms/cm$^3$ for a predetermined thickness of the metal layer of about 8 nm; and reacting the metal layer with the source/drain regions to form metal silicide regions in the source/drain regions.

12. The method as recited in claim 11 wherein adjusting includes adjusting thermal process conditions for a reaction between the metal layer and the substrate.

13. The method as recited in claim 11 wherein the fluorine is included in the source/drain regions using a fluorine containing plasma.

* * * * *